United States Patent
Fukuda

(10) Patent No.: US 11,817,847 B2
(45) Date of Patent: Nov. 14, 2023

(54) ELASTIC WAVE DEVICE

(71) Applicant: Murata Manufacturing Co., Ltd., Nagaokakyo (JP)

(72) Inventor: Daisuke Fukuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1441 days.

(21) Appl. No.: 16/152,591

(22) Filed: Oct. 5, 2018

(65) Prior Publication Data
US 2019/0044497 A1    Feb. 7, 2019

Related U.S. Application Data

(63) Continuation of application No. PCT/JP2017/006910, filed on Feb. 23, 2017.

(30) Foreign Application Priority Data

Apr. 28, 2016  (JP) ................. 2016-090065

(51) Int. Cl.
*H03H 9/10* (2006.01)
*H03H 9/25* (2006.01)
(Continued)

(52) U.S. Cl.
CPC ........ *H03H 9/1092* (2013.01); *H03H 9/0585* (2013.01); *H03H 9/1071* (2013.01);
(Continued)

(58) Field of Classification Search
CPC .......... H03H 9/145; H03H 9/059; H03H 9/25; H03H 9/1071; H03H 9/0585; H03H 9/1092
See application file for complete search history.

(56) References Cited

U.S. PATENT DOCUMENTS 8,093,506 B2 *  1/2012  Kawabe ............ H01L 23/49822
                                                174/265
8,237,270 B2 *  8/2012  Kobayashi ........... H05K 3/4007
                                                438/533
(Continued)

FOREIGN PATENT DOCUMENTS

JP   2006-165231 A    6/2006
JP   2010-278972 A   12/2010
(Continued)

OTHER PUBLICATIONS

Official Communication issued in corresponding Korean Patent Application No. 10-2018-7028006, dated Aug. 19, 2019.
(Continued)

*Primary Examiner* — J. San Martin
(74) *Attorney, Agent, or Firm* — KEATING & BENNETT, LLP

(57) ABSTRACT

An elastic wave device includes a piezoelectric substrate, an interdigital transducer electrode on the piezoelectric substrate, a support on the piezoelectric substrate, including a cavity, and surrounding the interdigital transducer electrode at the cavity, a cover covering the cavity and provided on the support, and a via hole electrode penetrating the cover and the support. The via hole electrode includes a projection portion projecting outward from a side surface portion when seen in a plan view. The projection portion is located within the cover.

11 Claims, 5 Drawing Sheets

(51) Int. Cl.
H03H 9/05 (2006.01)
H03H 9/145 (2006.01)

(52) U.S. Cl.
CPC ............... *H03H 9/25* (2013.01); *H03H 9/059* (2013.01); *H03H 9/145* (2013.01)

(56) References Cited

U.S. PATENT DOCUMENTS

| | | | | |
|---|---|---|---|---|
| 9,018,538 | B2* | 4/2015 | Kodani | H01L 23/49811 |
| | | | | 174/262 |
| 9,693,445 | B2* | 6/2017 | Ku | H05K 1/115 |
| 11,398,809 | B2* | 7/2022 | Sekiya | H10N 30/883 |
| 11,437,563 | B2* | 9/2022 | Park | H10N 30/20 |
| 2011/0234055 | A1* | 9/2011 | Fukano | H10N 30/87 |
| | | | | 310/365 |
| 2012/0032759 | A1* | 2/2012 | Nishii | H03H 9/6433 |
| | | | | 310/313 R |
| 2013/0100626 | A1* | 4/2013 | Inoue | H05K 1/118 |
| | | | | 174/250 |
| 2017/0093366 | A1 | 3/2017 | Kikuchi et al. | |
| 2018/0130759 | A1* | 5/2018 | Ho | H01L 23/49811 |
| 2019/0019939 | A1* | 1/2019 | Park | H10N 30/20 |
| 2020/0014365 | A1* | 1/2020 | Nambu | H03H 9/6483 |

FOREIGN PATENT DOCUMENTS

| | | | | |
|---|---|---|---|---|
| JP | 2011155196 | A | * | 8/2011 |
| JP | 2014127623 | A | * | 7/2014 ........... H05K 3/0035 |
| JP | 2014-146906 | A | | 8/2014 |
| JP | 2014-222886 | A | | 11/2014 |
| JP | 2016-010026 | A | | 1/2016 |
| WO | 2010/125873 | A1 | | 11/2010 |
| WO | 2015/199132 | A1 | | 12/2015 |

OTHER PUBLICATIONS

Official Communication issued in International Patent Application No. PCT/JP2017/006910, dated May 16, 2017.
Official Communication issued in corresponding Chinese Patent Application No. 201780025009.X, dated Oct. 11, 2021.

* cited by examiner

ELASTIC WAVE DEVICE

CROSS REFERENCE TO RELATED APPLICATIONS

This application claims the benefit of priority to Japanese Patent Application No. 2016-090065 filed on Apr. 28, 2016 and is a Continuation Application of PCT Application No. PCT/JP2017/006910 filed on Feb. 23, 2017. The entire contents of each application are hereby incorporated herein by reference.

BACKGROUND OF THE INVENTION

1. Field of the Invention

The present invention relates to an elastic wave device having a WLP (Wafer Level Package) structure.

2. Description of the Related Art

An elastic wave device has been widely used for a filter of a cellular phone, etc. For example, Japanese Unexamined Patent Application Publication No. 2014-222886 describes an example of an elastic wave device having a WLP structure. The elastic wave device includes a frame member provided on a piezoelectric substrate; and a cover provided on the frame member. A via hole electrode is provided so as to penetrate the frame member and the cover. The via hole electrode includes a first columnar portion located in the frame member; and a second columnar portion located in the cover. The second columnar portion includes an inclined side surface. Thus, for example, when stress is applied to the elastic wave device, the via hole electrode is unlikely to come out from the frame member and the cover.

In the elastic wave device described in Japanese Unexamined Patent Application Publication No. 2014-222886, when the inclination angle of the side surface of the second columnar portion is small, the via hole electrode tends to easily come out.

SUMMARY OF THE INVENTION

Preferred embodiments of the present invention provide elastic wave devices from which a via hole electrode is unlikely to come out.

An elastic wave device according to a preferred embodiment of the present invention includes a piezoelectric substrate; an interdigital transducer electrode provided on the piezoelectric substrate; a support provided on the piezoelectric substrate, including a cavity, and surrounding the interdigital transducer electrode at the cavity; a cover covering the cavity and provided on the support; and a via hole electrode penetrating the cover and the support and including an end portion located at the piezoelectric substrate side, another end portion located at a side opposite to the piezoelectric substrate side, and a side surface portion connecting the end portion and the other end portion, wherein the via hole electrode includes a projection portion projecting outward from the side surface portion when seen in a plan view, and the projection portion is located within the cover.

In an elastic wave device according to a preferred embodiment of the present invention, the projection portion includes a projection surface extending in a direction crossing a direction in which the via hole electrode extends. In this case, it is possible to effectively prevent the via hole electrode from coming out from the support and the cover.

In an elastic wave device according to a preferred embodiment of the present invention, the projection surface extends in a direction orthogonal or substantially orthogonal to the direction in which the via hole electrode extends. In this case, it is possible to more effectively prevent the via hole electrode from coming out from the support and the cover.

In an elastic wave device according to a preferred embodiment of the present invention, the cover includes an adhesive layer bonded to the support and a protective layer provided on the adhesive layer, and the adhesive layer has an elastic modulus lower than that of the protective layer.

In an elastic wave device according to a preferred embodiment of the present invention, the projection portion is located on a surface of the adhesive layer or within the adhesive layer.

In an elastic wave device according to a preferred embodiment of the present invention, the projection portion includes a projection surface extending in a direction crossing a direction in which the via hole electrode extends, and the projection surface is in contact with a main surface at the adhesive layer side of the protective layer of the cover. In this case, the projection surface is in contact with the protective layer having a higher elastic modulus than the adhesive layer. Thus, the via hole electrode is more unlikely to come out from the support and the cover.

In an elastic wave device according to a preferred embodiment of the present invention, the projection portion includes a projection surface extending in a direction crossing the direction in which the via hole electrode extends, and, when a direction traversing the via hole electrode is defined as a width direction, the side surface portion of the via hole electrode is inclined such that the via hole electrode is widened from the end portion located at the piezoelectric substrate side, to the projection surface. In this case, the via hole electrode is more unlikely to come out from the support and the cover.

In an elastic wave device according to a preferred embodiment of the present invention, the projection portion includes a projection surface extending in a direction crossing the direction in which the via hole electrode extends, and the other end portion located at the side opposite to the piezoelectric substrate side of the via hole electrode has a planar area larger than a cross-sectional area of a portion of the via hole electrode on which the projection surface is located. In this case, when a bump or other joining member is joined to the end portion of the via hole electrode at the side opposite to the piezoelectric substrate, it is possible to effectively increase joining strength of the end portion and the bump or other joining member.

In an elastic wave device according to a preferred embodiment of the present invention, the adhesive layer is made of an epoxy resin, and the protective layer is made of polyimide.

According to preferred embodiments of the present invention, it is possible to provide elastic wave devices from which a via hole electrode is unlikely to come out.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention.

It should be noted that each preferred embodiment described in the present specification is illustrative, and the components in the different preferred embodiments may be partially replaced or combined.

Figure 1:
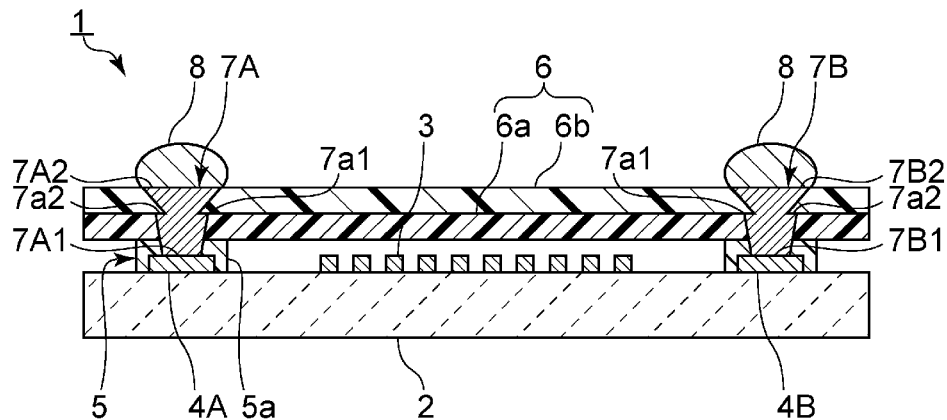
FIG. 1 is a front cross-sectional view of an elastic wave device according to a first preferred embodiment of the present invention.

FIG. 1 is a front cross-sectional view of an elastic wave device according to a first preferred embodiment of the present invention.

The elastic wave device 1 includes a piezoelectric substrate 2. The piezoelectric substrate 2 is preferably made of, for example, an appropriate piezoelectric single crystal or piezoelectric ceramics. An interdigital transducer electrode 3 is provided on the piezoelectric substrate 2. When an alternating voltage is applied to the interdigital transducer electrode 3, an elastic wave is excited.

Electrode lands 4A and 4B are provided on the piezoelectric substrate 2. In the present preferred embodiment, the electrode lands 4A and 4B are electrically connected to the interdigital transducer electrode 3.

A support 5 including a cavity 5a is provided on the piezoelectric substrate 2. The support 5 covers the electrode lands 4A and 4B. The interdigital transducer electrode 3 is located within the cavity 5a and surrounded by the support 5. The support 5 is made of an appropriate resin or other suitable material.

A cover 6 is provided on the support 5 and covers the cavity 5a. Accordingly, a hollow space surrounded by the piezoelectric substrate 2, the support 5, and the cover 6 is provided. The cover 6 includes an adhesive layer 6a bonded to the support 5. The cover 6 includes a protective layer 6b provided on the adhesive layer 6a. The elastic modulus of the adhesive layer 6a is higher than that of the protective layer 6b. The material of the adhesive layer 6a is not particularly limited, but the adhesive layer 6a is preferably made of, for example, an epoxy resin. The material of the protective layer 6b is not particularly limited, but the protective layer 6b is preferably made of, for example, polyimide. The cover 6 may not include the adhesive layer 6a and the protective layer 6b.

Via hole electrodes 7A and 7B penetrate the support 5 and the cover 6. The via hole electrodes 7A and 7B include first end portions 7A1 and 7B1 which are end portions at the piezoelectric substrate 2 side, and second end portions 7A2 and 7B2 which are other end portions at the side opposite to the piezoelectric substrate 2 side, respectively. The via hole electrode 7A includes a side surface portion connecting the first end portion 7A1 and the second end portion 7A2. Similarly, the via hole electrode 7B includes a side surface portion connecting the first end portion 7B1 and the second end portion 7B2. The planar shapes of the via hole electrodes 7A and 7B are not particularly limited, but are preferably, for example, circular or substantially circular in the present preferred embodiment.

The first end portion 7A1 of the via hole electrode 7A is connected to the electrode land 4A. The first end portion 7B1 of the via hole electrode 7B is connected to the electrode land 4B. Bumps 8 are joined to the respective second end portions 7A2 and 7B2 of the via hole electrodes 7A and 7B. The via hole electrodes 7A and 7B are preferably made of an appropriate metal, for example. The bumps 8 are preferably made of solder or other suitable material, for example.

In mounting the elastic wave device 1, the elastic wave device 1 is joined to a mount substrate with the bumps 8 interposed therebetween. In the present preferred embodiment, the interdigital transducer electrode 3 is electrically connected to the outside via the electrode lands 4A and 4B, the via hole electrodes 7A and 7B, and the bumps 8. A conductive binder or a terminal other than the bump 8 may be joined to the second end portions 7A2 and 7B2 of the via hole electrodes 7A and 7B.

Figure 2:
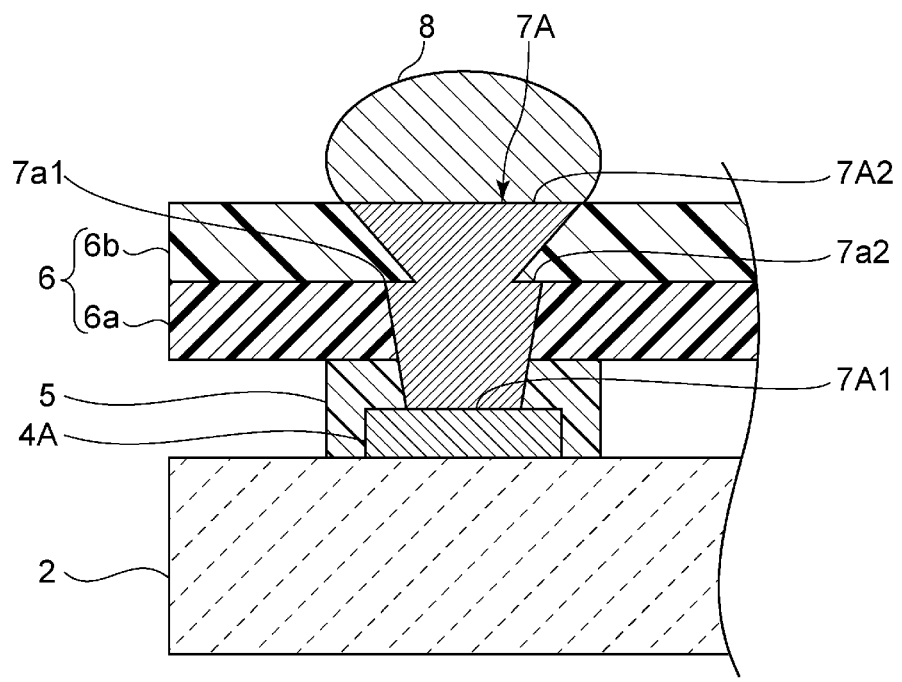
FIG. 2 is an enlarged front cross-sectional view of an area around a via hole electrode of the elastic wave device according to the first preferred embodiment of the present invention.

FIG. 2 is an enlarged front cross-sectional view of an area around the via hole electrode of the elastic wave device according to the first preferred embodiment.

As shown in FIG. 2, the via hole electrode 7A includes a projection portion 7a1 between the first end portion 7A1 and the second end portion 7A2 that projects outward from the side surface portion when being seen in a plan view. In the present preferred embodiment, the projection portion 7a1 includes a projection surface 7a2 extending in a direction orthogonal or substantially orthogonal to the direction in which the via hole electrode 7A extends. The projection surface 7a2 only needs to extend in a direction crossing the direction in which the via hole electrode 7A extends.

The projection portion 7a1 is located within the cover 6. More specifically, the projection portion 7a1 is located at the adhesive layer 6a side in the cover 6. The projection surface 7a2 is in contact with the surface of the protective layer 6b at the adhesive layer 6a side.

Here, the direction traversing the via hole electrode 7A is defined as a width direction of the via hole electrode 7A. In the present preferred embodiment, the side surface portion of the via hole electrode 7A is inclined such that the width thereof increases from the first end portion 7A1 of the via hole electrode 7A to the projection surface 7a2. The side surface portion of the via hole electrode 7A at the second end portion 7A2 side with respect to the projection surface 7a2 is inclined such that the width thereof increases toward the second end portion 7A2.

The via hole electrode 7B shown in FIG. 1 also has the same or substantially the same configuration as the via hole electrode 7A. The elastic wave device 1 may include a plurality of via hole electrodes other than the via hole electrodes 7A and 7B. At least one of the plurality of via hole electrodes of the elastic wave device 1 only needs to have the configuration of the via hole electrode 7A.

The feature of the present preferred embodiment is that the via hole electrode 7A includes the projection portion 7a1 located within the cover 6. The projection portion 7a1 and the cover 6 are in contact with each other. Accordingly, for example, when a force that pulls in the direction in which the via hole electrode 7A extends is applied to the elastic wave device 1, the via hole electrode 7A is unlikely to come out from the support 5 and the cover 6. In the following, the advantageous effects of the present preferred embodiment will be described in more detail by comparing the present preferred embodiment with a comparative example.

Figure 3:
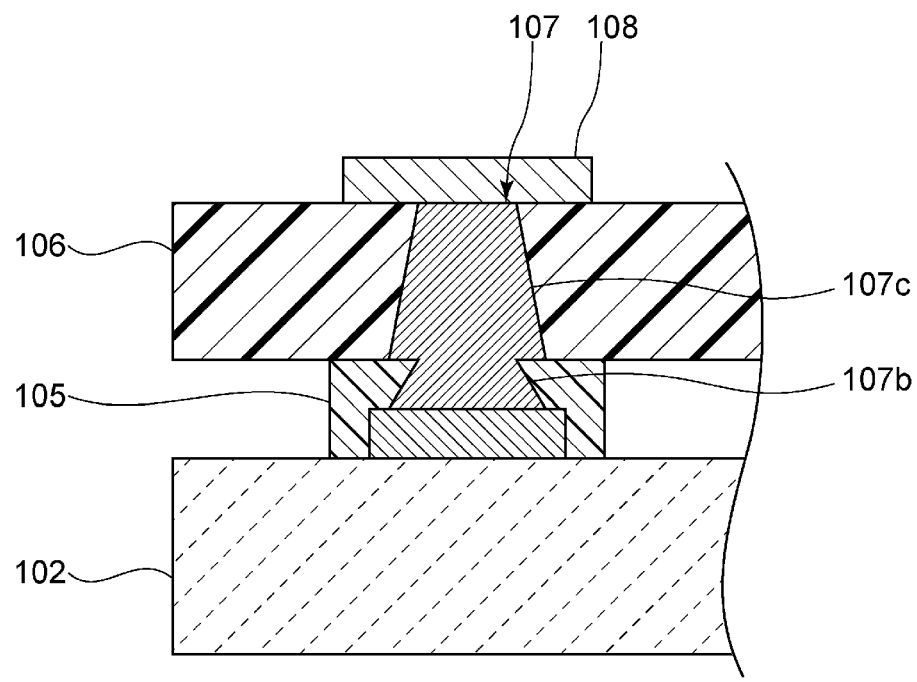
FIG. 3 is an enlarged front cross-sectional view of an area around a via hole electrode of an elastic wave device of a comparative example.

FIG. 3 is an enlarged front cross-sectional view of an area around a via hole electrode of an elastic wave device of the comparative example.

A via hole electrode 107 in the comparative example includes a first portion 107b penetrating a support 105, and a second portion 107c penetrating a cover 106. An end portion, at the piezoelectric substrate 102 side, of the second portion 107c is exposed from the cover 106 and is in contact with the support 105. The via hole electrode 107 includes no projection portion located within the cover 106. The second portion 107c includes an inclined side surface portion. A terminal 108 is connected to an end portion of the second portion 107c at the side opposite to the piezoelectric substrate 102 side.

In the comparative example, as the side surface portion of the second portion 107c is more greatly inclined toward the inner side when being seen in a plan view, it is possible to make the via hole electrode 107 more unlikely to come out from the support 105 and the cover 106. However, as the side surface portion of the second portion 107c is more greatly inclined as described, the joining area of the via hole electrode 107 and the terminal 108 decreases. Therefore, the joining strength of the via hole electrode 107 and the terminal 108 is decreased.

On the other hand, when the side surface portion of the second portion 107c is more greatly inclined as described above, if the planar area of the end portion, at the piezoelectric substrate 102 side, of the second portion 107c is increased, the contact area of the end portion and the support 105 increases. Thus, the joining area of the cover 106 and the support 105 decreases, so that the joining strength of the cover 106 and the support 105 is decreased.

The via hole electrode 107 is made of a metal, and the support 106 is made of a resin. Thus, the end portion of the via hole electrode 107 and the support 105 are difficult to join together. When the contact area of the end portion and the support 105 increases, the support 105 and the cover 106 tend to be easily separated from each other.

In contrast, in the present preferred embodiment shown in FIG. 1, the via hole electrode 7A includes the projection portion 7a1 located within the cover 6. Thus, it is possible to effectively make the via hole electrode 7A unlikely to come out from the support 5 and the cover 6 without decreasing the joining strength of the support 5 and the cover 6.

In addition, in the present preferred embodiment, it is not necessary to decrease the joining area of the second end portion 7A2 of the via hole electrode 7A and the bump 8. Thus, it is possible to achieve the above-described advantageous effects without decreasing the joining strength of the via hole electrode 7A and the bump 8.

The projection portion 7a1 preferably includes the projection surface 7a2. Accordingly, it is possible to effectively prevent the via hole electrode 7A from coming out from the support 5 and the cover 6. More preferably, the projection surface 7a2 extends in a direction orthogonal or substantially orthogonal to the direction in which the via hole electrode 7A extends. The projection surface 7a2 and the cover 6 are in contact with each other. Accordingly, for example, when a force that pulls in the direction in which the via hole electrode 7A extends is applied to the elastic wave device 1, it is possible to further prevent the via hole electrode 7A from coming out from the support 5 and the cover 6.

The projection portion 7a1 may be located on the surface of the adhesive layer 6a or within the adhesive layer 6a. In the case in which the projection portion 7a1 includes the projection surface 7a2 as in the present preferred embodiment, the projection surface 7a2 is preferably in contact with the main surface at the adhesive layer 6a side of the protective layer 6b. Since the projection surface 7a2 is in contact with the protective layer 6b having a higher elastic modulus than the adhesive layer 6a, the via hole electrode 7A is more unlikely to come out from the support 5 and the cover 6.

In the case in which the projection surface 7a2 extends in the direction orthogonal to the direction in which the via hole electrode 7A extends, it is possible to suitably bring the projection surface 7a2 into contact with the main surface of the protective layer 6b.

Figure 4:
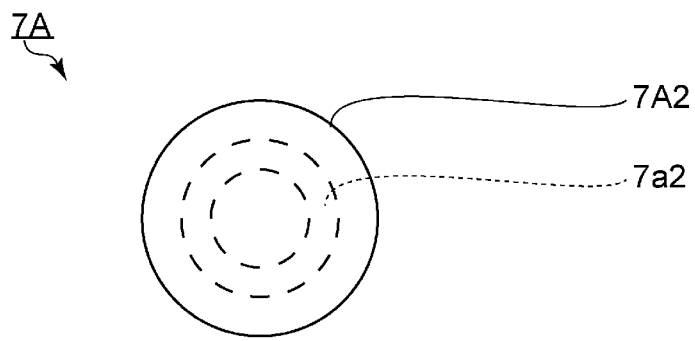
FIG. 4 is a plan view of the via hole electrode in the first preferred embodiment of the present invention.

In the present preferred embodiment, the side surface portion of the via hole electrode 7A is inclined as described above. Accordingly, the via hole electrode 7A is more unlikely to come out from the support 5 and the cover 6. In addition, as shown in the plan view of FIG. 4, the planar area of the second end portion 7A2 is larger than the traverse area of a portion of the via hole electrode 7A on which the projection surface 7a2 is located. Thus, it is possible to increase the joining area of the via hole electrode 7A and the bump 8. Therefore, it is possible to effectively increase the joining strength of the via hole electrode 7A and the bump 8.

In a portion of the cover 6 other than the portions in which the plurality of via hole electrodes are located, the entire or substantially the entire surface at the protective layer 6b side of the adhesive layer 6a and the entire or substantially the entire surface at the adhesive layer 6a side of the protective layer 6b are preferably joined together. Accordingly, the adhesive layer 6a and the protective layer 6b are unlikely to be separated from each other.

Figure 5:
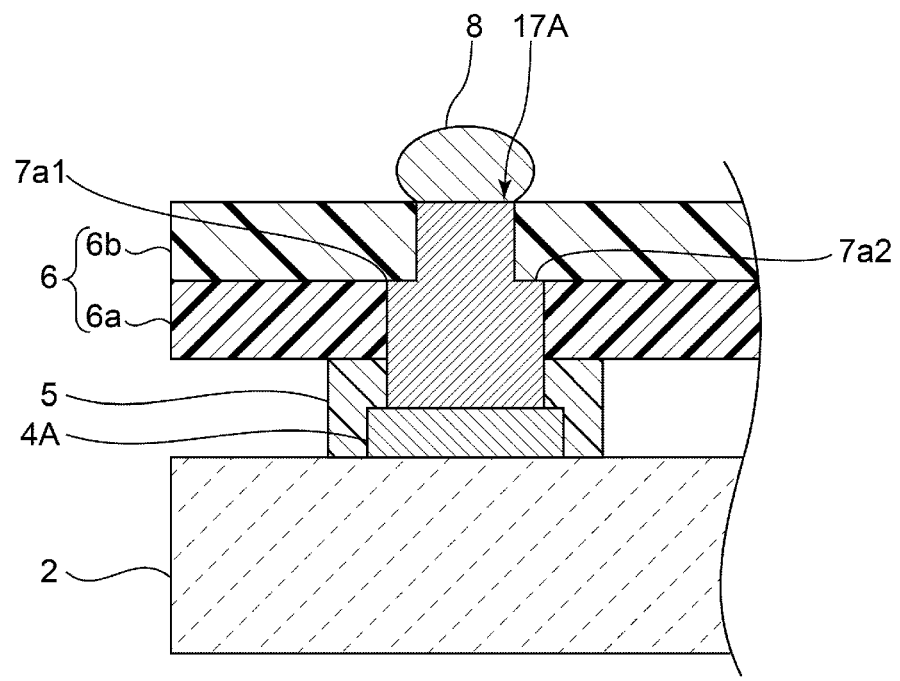
FIG. 5 is an enlarged front cross-sectional view of an area around a via hole electrode of an elastic wave device according to a modification of the first preferred embodiment of the present invention.

As in a modification of the first preferred embodiment shown in FIG. 5, a side surface portion of a via hole electrode 17A may not be inclined.

Hereinafter, an example of a non-limiting example of a method for producing the elastic wave device 1 according to the present preferred embodiment will be described.

FIGS. 6A to 6D are each a front cross-sectional view for describing the method for producing the elastic wave device according to the first preferred embodiment.

Figure 6A:
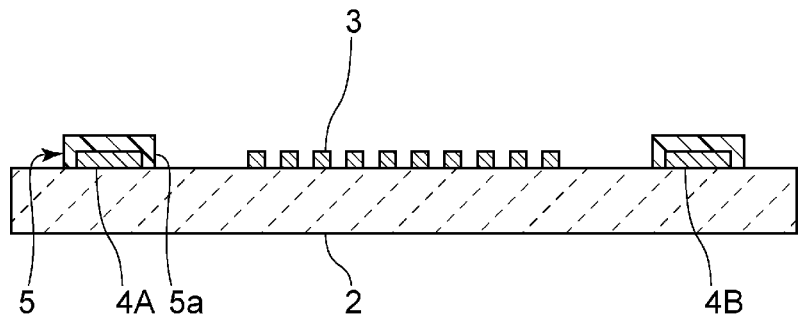
FIGS. 6A to 6D are each a front cross-sectional view for describing a method for producing the elastic wave device according to the first preferred embodiment of the present invention.

As shown in FIG. 6A, the piezoelectric substrate 2 is prepared. Next, the interdigital transducer electrode 3 and the electrode lands 4A and 4B are provided on the piezoelectric substrate 2. It is possible to provide the interdigital transducer electrode 3 and the electrode lands 4A and 4B, for example, by a sputtering method, a CVD method, or other suitable method.

Next, the support 5 is provided on the piezoelectric substrate 2 so as to include the cavity 5a surrounding the interdigital transducer electrode 3. At this time, the support 5 is provided so as to cover at least portions of the electrode lands 4A and 4B. Accordingly, in a subsequent step, it is possible to connect the via hole electrodes and the electrode lands 4A and 4B. It is possible to provide the support 5, for example, by photolithography.

Figure 6B:
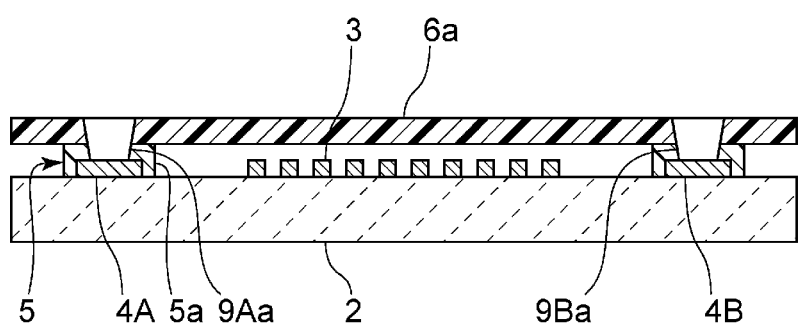

Next, as shown in FIG. 6B, the adhesive layer 6a is provided on the support 5 so as to cover the cavity 5a. Next, via holes 9Aa and 9Ba are formed so as to penetrate the adhesive layer 6a and the support 5. The via holes 9Aa and 9Ba are formed such that the electrode lands 4A and 4B are exposed from the support 5 at the via holes 9Aa and 9Ba, respectively. It is possible to form the via holes 9Aa and 9Ba by application of laser light, for example. Alternatively, the via holes 9Aa and 9Ba may be formed by mechanical cutting or other suitable method.

Figure 6C:
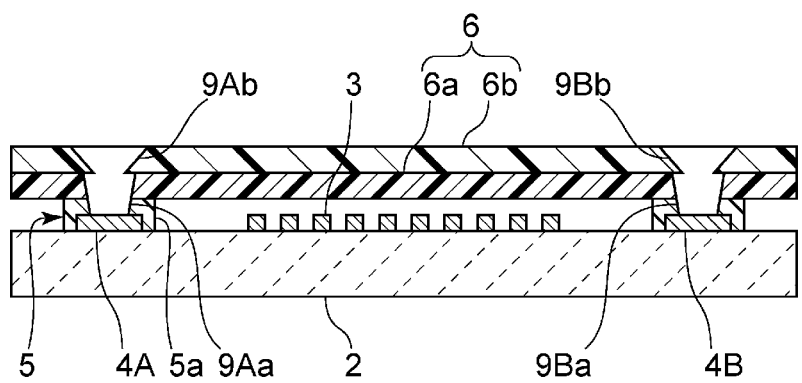

Next, as shown in FIG. 6C, the protective layer 6b is stacked on the adhesive layer 6a. Next, a via hole 9Ab is formed at a position overlapping the via hole 9Aa in a plan view so as to penetrate the protective layer 6b. The via hole 9Ab is formed such that the width of an end portion at the piezoelectric substrate 2 side of the via hole 9Ab is smaller than the width of an end portion at the protective layer 6b side of the via hole 9Aa. At this time, in a portion at which the adhesive layer 6a and the protective layer 6b are bonded together, the outer edge of the via hole 9Aa is located outside the outer edge of the via hole 9Ab when seen in a plan view.

Similarly, a via hole 9Bb is formed at a position overlapping the via hole 9Ba in a plan view so as to penetrate the protective layer 6b. It is possible to form the via holes 9Ab and 9Bb, for example, by application of laser light or mechanical cutting.

In the present preferred embodiment, the via holes 9Aa, 9Ab, 9Ba, and 9Bb are formed such that side surface portions of the via holes 9Aa, 9Ab, 9Ba, and 9Bb are inclined. The side surface portions of the via holes 9Aa, 9Ab, 9Ba, and 9Bb may not be inclined. In addition, the method for forming the via hole is an example, and the method for forming such a via hole is not limited to the above-described method.

Figure 6D:
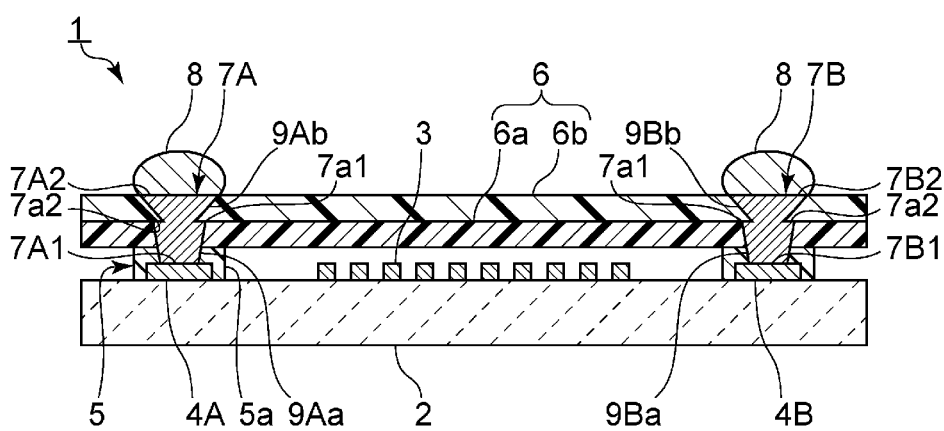

Next, as shown in FIG. 6D, the via hole electrode 7A is provided in the via holes 9Aa and 9Ab. In the present preferred embodiment, the via hole electrode 7A includes a portion formed so as to extend along the outer edge of the via hole 9Ab from the outer edge 9Aa at the portion at which the adhesive layer 6a and the protective layer 6b are bonded together. This portion defines the projection surface 7a2 of the via hole electrode 7A.

Similarly, the via hole electrode 7B is provided in the via holes 9Ba and 9Bb. Accordingly, the via hole electrodes 7A and 7B and the electrode lands 4A and 4B are connected to each other. It is possible to provide the via hole electrodes 7A and 7B, for example, by an electrolytic plating method. Next, the bumps 8 are joined to the respective second end portions 7A2 and 7B2 of the via hole electrodes 7A and 7B.

In the step of preparing the piezoelectric substrate 2, a mother piezoelectric substrate may be prepared. Specifically, a plurality of elastic wave devices 1 may be formed on the mother piezoelectric substrate at the same time, and each elastic wave device 1 may be obtained by dividing the mother piezoelectric substrate into individual pieces.

Figure 7:
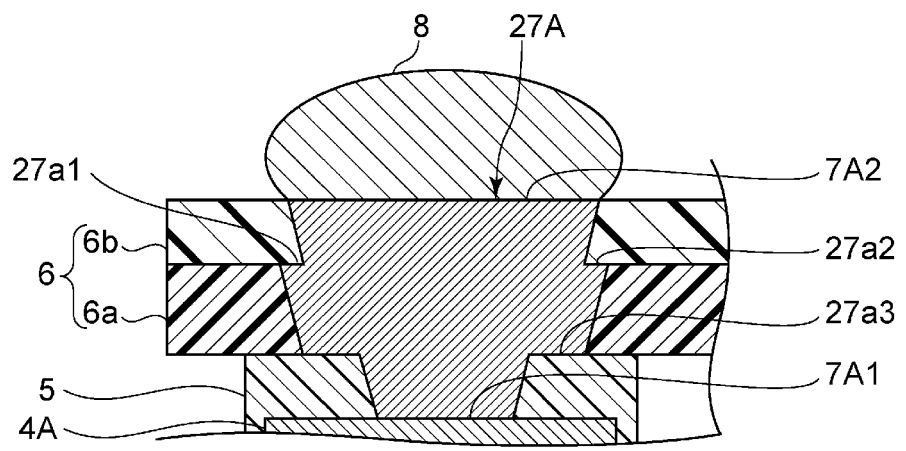
FIG. 7 is an enlarged front cross-sectional view of an area around a via hole electrode of an elastic wave device according to a second preferred embodiment of the present invention.

FIG. 7 is an enlarged front cross-sectional view of an area around a via hole electrode of an elastic wave device according to a second preferred embodiment of the present invention.

The present preferred embodiment is different from the first preferred embodiment in that a projection portion 27a1 of a via hole electrode 27A includes a first projection surface 27a2 and a second projection surface 27a3. Regarding points other than the above, the elastic wave device of the second preferred embodiment has the same or substantially the same configuration as the elastic wave device 1 of the first preferred embodiment.

The first projection surface 27a2 and the second projection surface 27a3 extend in a direction orthogonal or substantially orthogonal to the direction in which the via hole electrode 27A extends. The first projection surface 27a2 is located at the second end portion 7A2 side, and the second projection surface 27a3 is located at the first end portion 7A1 side. The first projection surface 27a2 and the second projection surface 27a3 only need to extend in a direction crossing the direction in which the via hole electrode 27A extends.

Similar to the projection surface 7a2 in the first preferred embodiment shown in FIG. 1, the first projection surface 27a2 is in contact with the surface at the adhesive layer 6a side of the protective layer 6b. The second projection surface 27a3 is in contact with the surface at the adhesive layer 6a side of the support 5. Accordingly, the via hole electrode 27A is more unlikely to come out.

As described above, in the present preferred embodiment, the via hole electrode 27A is in contact at the first projection surface 27a2 and the second projection surface 27a3 with both of the surface at the adhesive layer 6a side of the protective layer 6b and the surface at the adhesive layer 6a side of the support 5. Accordingly, the creepage distance from a second end surface 7A2 to a first end surface 7A1 on the interface between the via hole electrode 27A, and the cover 6 and the support 5 is relatively long. Therefore, even when moisture enters from the outside, it is possible to decrease the entry speed of the moisture, so that a wiring electrode is unlikely to corrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   an interdigital transducer electrode provided on the piezoelectric substrate;
   a support provided on the piezoelectric substrate, including a cavity, and surrounding the interdigital transducer electrode at the cavity;
   a cover covering the cavity and provided on the support; and
   a via hole electrode penetrating the cover and the support and including a first end portion located at a piezoelectric substrate side, a second end portion located at a side opposite to the piezoelectric substrate side, and a side surface portion connecting an outer edge of the first end portion and an outer edge of the second end portion; wherein
   the via hole electrode includes a projection portion projecting outward from the side surface portion when seen in a plan view;
   the projection portion is located within the cover;
   the projection portion includes a first projection surface and a second projection surface located at an end portion side with respect to the first projection surface;
   the first projection surface and the second projection surface extend in a direction crossing a direction in which a via hole electrode extends;
   the cover includes an adhesive layer bonded to the support and a protective layer provided on the adhesive layer;

the first projection surface is in contact with a surface at an adhesive layer side of the protective layer;

the second projection surface is in contact with a surface at the adhesive layer side of the support; and when a direction traversing the via hole electrode is defined as a width direction, the side surface portion of the via hole electrode is inclined such that the via hole electrode is widened from the second projection surface to the first projection surface.

2. The elastic wave device according to claim 1, wherein the first projection surface and the second projection surface extend in a direction orthogonal or substantially orthogonal to the direction in which the via hole electrode extends.

3. The elastic wave device according to claim 1, wherein the adhesive layer has an elastic modulus lower than that of the protective layer.

4. The elastic wave device according to claim 1, wherein the second end portion located at the side opposite to the piezoelectric substrate side of the via hole electrode has a planar area larger than a cross-sectional area of a portion of the via hole electrode on which the second projection surface is located.

5. The elastic wave device according to claim 1, wherein the adhesive layer is made of an epoxy resin, and the protective layer is made of polyimide.

6. The elastic wave device according to claim 1, further comprising:
 an electrode land provided on the piezoelectric substrate; wherein
 the support covers the electrode land.

7. The elastic wave device according to claim 6, wherein the first end portion of the via hole electrode is connected to the electrode land.

8. The elastic wave device according to claim 1, wherein the piezoelectric substrate, the support, and the cover define a hollow space in which the interdigital transducer electrode is disposed.

9. The elastic wave device according to claim 1, wherein the support is made of resin.

10. The elastic wave device according to claim 1, wherein a solder bump is joined to the second end portion of the via hole electrode.

11. The elastic wave device according to claim 1, wherein the via hole electrode has a circular or substantially circular planar shape.

\* \* \* \* \*